United States Patent [19]

Goode

[11] 3,983,554

[45] Sept. 28, 1976

[54] ELECTRIC POWER DISTRIBUTION SYSTEM INCLUDING A MASTER ANNUNICATOR AND CENTRAL CONTROL UNIT

[75] Inventor: John Park Goode, Fort Mitchell, Ky.

[73] Assignee: ESB Incorporated, Philadelphia, Pa.

[22] Filed: Mar. 25, 1975

[21] Appl. No.: 561,794

[52] U.S. Cl. ............................ 340/413; 340/213.1; 340/255
[51] Int. Cl.² ........................................ G08B 26/00
[58] Field of Search ................. 340/413, 213.1, 255

[56] References Cited
UNITED STATES PATENTS

| | | | |
|---|---|---|---|
| 2,707,778 | 5/1955 | Neiswinter | 340/255 X |
| 2,883,651 | 4/1959 | Akerlund | 340/413 |
| 3,217,306 | 11/1965 | Hillman | 340/413 |
| 3,657,714 | 4/1972 | Kessler | 340/413 X |
| 3,699,392 | 10/1972 | Lee et al. | 340/255 X |
| 3,737,765 | 6/1973 | Lee et al. | 340/255 |

Primary Examiner—David L. Trafton
Attorney, Agent, or Firm—Anthony J. Rossi

[57] ABSTRACT

An Electric Distribution system for hospital use includes a plurality of ungrounded remote Power Supplies. Each remote Power Supply is provided with a Line Isolation Monitor. A Master Annunciator and Central Control Unit is connected to the several Line Isolation Monitors. The Master Unit, located at a central point, emits an alarm signal whenever the ground leakage current of any Power Supply exceeds a preselected value. The Master Unit also identifies the faulty Supply. Means are provided to measure the magnitude of the ground leakage. In a check mode, the Master Unit will sequentially read the leakage current of each remote Power Supply. In a test mode, the Master Unit will sequentially place artificial ground faults in each remote Supply so as to check the operation of each remote Monitor. Further circuitry may be provided to give an alarm at the Master Unit in the event that any one of the Monitors becomes inoperative due to power failure or loss of ground connection.

2 Claims, 7 Drawing Figures

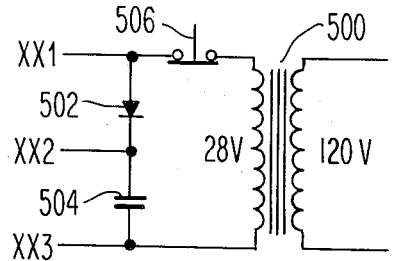
*Fig. 4*
*Fig. 5*
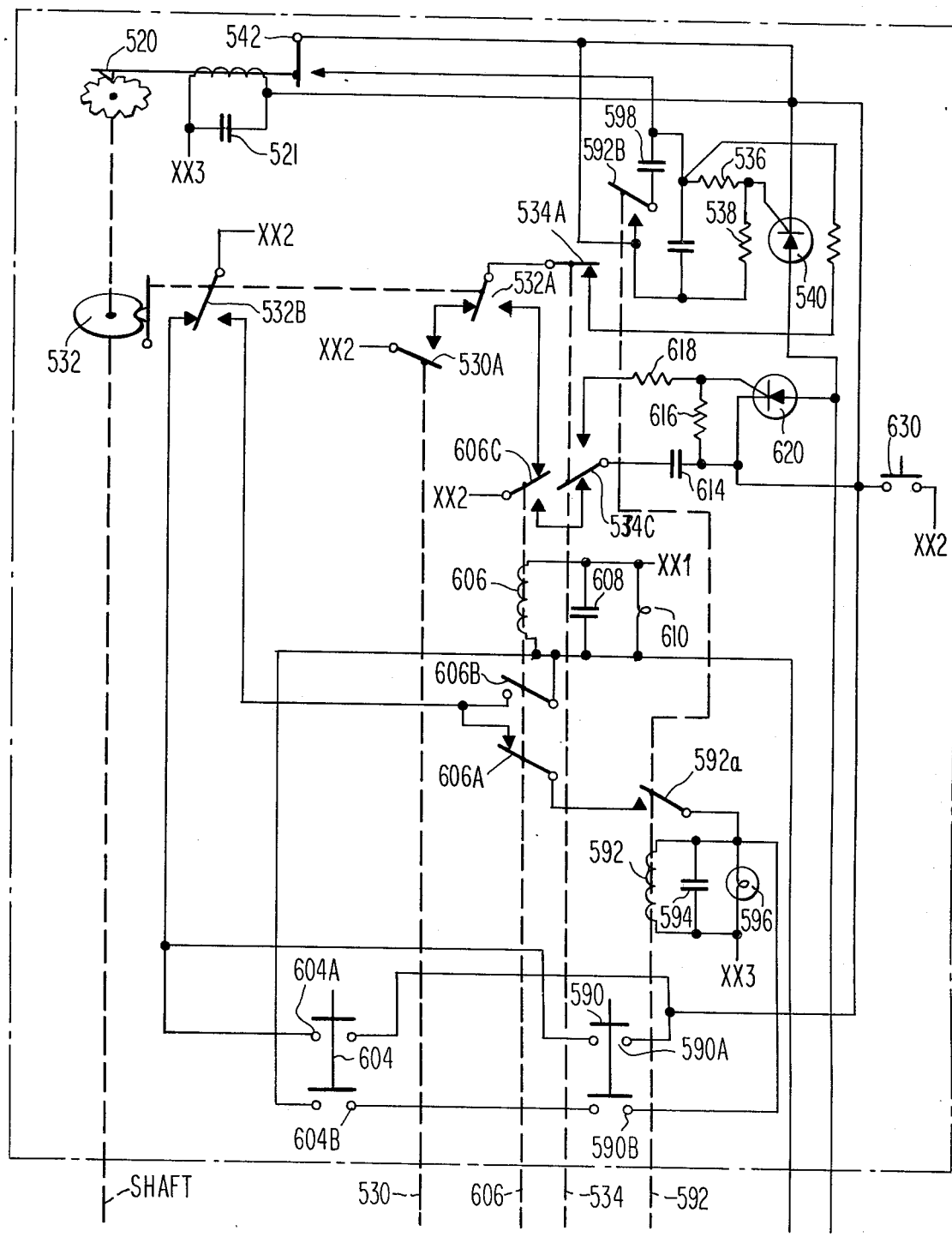

ELECTRIC POWER DISTRIBUTION SYSTEM INCLUDING A MASTER ANNUNICATOR AND CENTRAL CONTROL UNIT

BACKGROUND OF THE INVENTION

1. Field of the Invention

This invention relates to ungrounded or isolated power supplies. In particular, it relates to surveilance means for an installation comprising several isolated power supplies.

2. Description of the Prior Art

The need for ground fault detection in electric power distribution is as old as the power distribution art. Many devices have been proposed to aid the power supplier in sensing and finding such faults. In recent years, hospitals have found it desirable to use isolated power supplies for use in operation rooms, etc., so as to avoid as much as possible accidents resulting from electrical sparks, shocks, etc. To indicate that the isolated power supplies are actually free of grounds, line isolation monitors have been developed. A regulatory agency, National Fire Prevention Association (NFPA - 56, 1956), has set up standards for ground isolation in hospitals. To comply with the standards, a total leakage no greater than 0.002 amperes from line to ground is allowable. Included in this leakage figure is the capacitative leakage of the power supply itself, and the power required to drive the ground indicating device. With the limits on leakage as set up by NFPA, it is desirable that the driving power of the ground sensor be kept as at low a value as possible so that the growth of leakages below the allowable maximum can be watched. In general, the leakage contribution of many presently known ground fault detectors is of the order of 0.0005 amperes. With the limit of 0.002 amps total leakage for a system, the relatively high current draw of such devices prevents any accurate reading of the possible fault currents.

In a typical hospital installation, power is fed from the utilities lines to an isolation transformer. Nongrounded power lines from the isolation transformer feed one or more operating rooms, intensive care wards, etc. A line isolation monitor is connected to the non-grounded lines at any suitable spot. In a preferred installation, a signal is provided at each use area to advise that the power line is either: (a) free from grounds or (b) that a ground fault exists. In many hospital installations, there may be several isolated power supply systems, each with its own monitor. It is further requisite of NFPA-56 that each isolated power supply must be checked daily for leakage. In a large installation, say of ten or more separate power supplies, the daily check by trained personnel may require a considerable outlay of time in the course of a year for example. A means for electrically testing a number of isolated power supplies from a central point could be of real benefit to such an installation.

SUMMARY OF THE INVENTION

An installation comprising a number of remote isolated power supplies, each power supply having its own Line Isolation Monitor includes a Master Annunciator and Central Control Unit. Circuitry connects a master panel to the individual monitors. Means in the master panel are provided to register an alarm when the leakage of any power supply is above a selected value, to indicate which power supply is in trouble and indicate the magnitude of the leakage current. Where audible alarms are used, means are provided for their silencing as for instance when checking the circuits. Means are also provided for sequentially measuring the leakage currents of all the power supplies. Means are provided to insert a test fault in each power supply so as to prove the operation of each monitoring station. Further means are provided to give an alarm, in the event that any of the monitors become inoperative due to power failure, loss of ground connection or loss of alarm loop continuity.

From this Summary, it is seen that the Master Unit of the invention provides a desirable series of supervisory functions at a single observation point so as to enable an observer to check the full operation of each Line Isolation Monitor. By centralizing the supervision of the Remote Power Supplies, supervisory time is saved and better supervision is provided when compared to a multiple Remote Power Supply installation made without the Master Unit.

BRIEF DESCRIPTION OF THE DRAWINGS

FIG. 4 is the wiring diagram for a power supply suitable for use with the Master Unit of FIG. 3;

FIGS. 5 and 6 are the wiring diagram of the Master Unit of FIG. 3; and,

DESCRIPTION OF THE PREFERRED EMBODIMENT

This invention relates to an installation of a number of Remote Isolated Power Supplies, each power supply having its own Line Isolation Monitor. A single isolated power supply having a Line Isolation Monitor is described in U.S. patent application Ser. No. 518,098, filed Oct. 25, 1974, by the present inventor. Although the power supply and the associated monitor form only a periferal part of the present invention, a description thereof is desirable as an aid in the explanation of the use and operation of the present invention.

Figure 1:
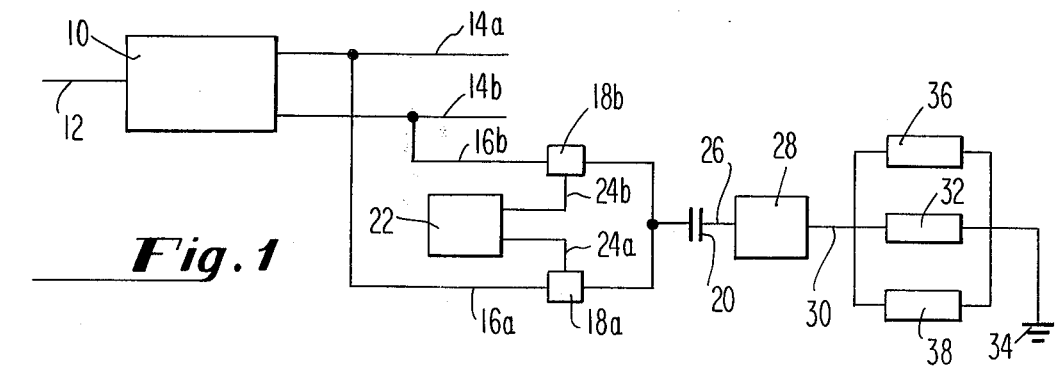
FIG. 1 depicts in block form a single Remote Power Supply with a Line Isolation Monitor connected thereto; Note: this is also FIG. 1 of application Ser. No. 518,098, filed Oct. 25, 1974.

In FIG. 1, isolation transformer 10 is fed by a utility line 12. A two wire isolated power line 14a, 14b, in most cases carrying 60 cycle 110 volt power, emerges from transformer 10 and is available for feeding operating room or other specialized equipment.

Fault sensing lead 16a connects power line 14a to a gate 18a and fault sensing lead 16b connects power line 14b to gate 18b. The output of gates 18a and 18b are led to one side of the fault current capacitor 20. A gate pulsing circuit 22 feeds gate 18a by lead 24a and gate 18b by lead 24b. The gate pulsing circuit causes the first gate and the second gate to cyclicly close and open at a chosen frequency, the first gate being closed during the periods that the second gate is open and the second gate being closed during the periods that the first gate is open. The frequency of the gate pulsing signals is not overly critical. It may be line frequency or somewhat lower or somewhat higher. The second terminal of capacitor 20 connects to one side 26 of the local oscillator 28. The local oscillator 28 provides an alternating current test signal having a frequency higher than the line frequency as for example in the neighborhood of 150–300 cycles per second and at for example, a voltage of about 14 volts (when the power line is at a nominal 120 volts). In a preferred embodiment, the local oscillator frequency is an irrational multiple of the line frequency. By this means, unwanted interaction between the two frequencies are avoided.

The second terminal of the test frequency power supply or local oscillator 28 is connected by lead 30 to resistor 32. The second terminal of the resistor connects to ground at 34. A means for sensing potential difference 36 across the resistor 32 serves to indicate the flow of fault current. A filter circuit 38, tuned to pass 60 cycle current, is placed in parallel with resistor 32. The filter 38 bypasses from resistor 32 most of the 60 cycle current flowing along the fault sensing circuit. The resulting current flowing through resistor 32 is about half 60 cycle and about half local oscillator current.

In operation, lines 16a and 16b are alternately connected to capacitor 20. Fault currents flow from the local oscillator 28 as well as from the power supply 10 through the external fault to ground and back via the resistor-filter-indicator circuit. The magnitude of the fault can be determined by a meter reading ad if the fault is greater than a prechosen value, a suitable danger signal, alarms, etc. in the circuitry can be caused to activate.

Figure 2:
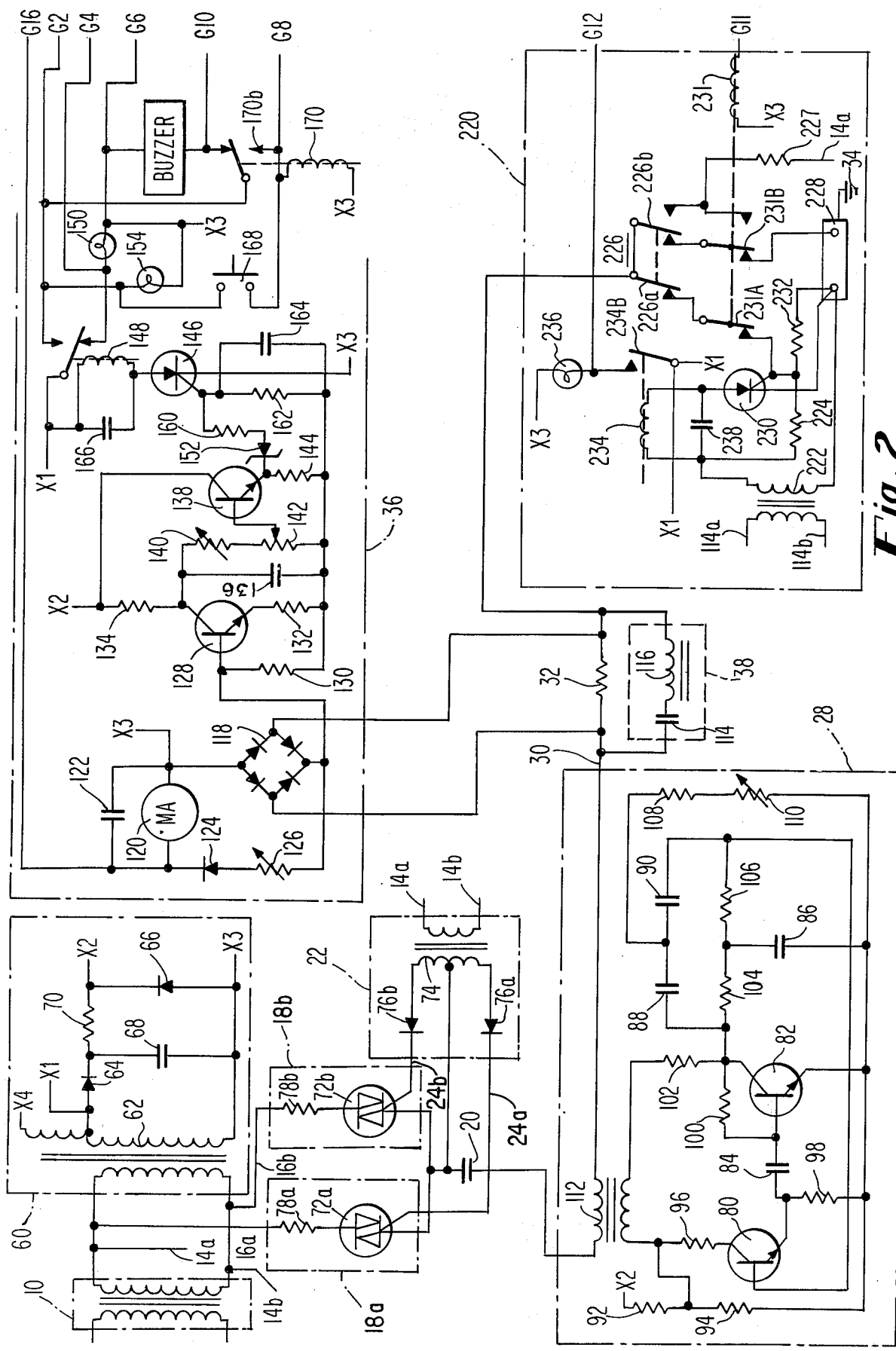
FIG. 2 is the wiring of the Line Isolation Monitor of FIG 1; Note: this is similar to FIG. 3 of application Ser. No. 518,098, filed Oct. 25, 1974 but it is not identical.

A complete wiring diagram for the line isolation monitor of FIG. 1 is shown in FIG. 2. All of the numbered items of FIG. 1 are shown and similarly numbered. In addition to the blocks of FIG. 1, a monitor power supply 60 will be noted. This comprises transformer 62, rectifiers 64, 66 capacitor 68 and resistor 70. The output of the power supply is low voltage ac at X1, higher voltage ac at X4, low voltage dc at X2 and return line X3.

The two gates 18a and 18b serving to connect fault sensing leads 16aand 16b to capacitor 20 are shown as two triacs 72a and 72b. The gate pulsing circuit 22 comprises center tapped transformer 74 and rectifier diodes 76a and 76b. The pulsing circuit 22 comprising transformer 74 and diodes 76a and 76b sends alternate direct current pulses to gates 18a and 18b at a rate of 120 pulses per second. Resistors 78a and 78b are included in the fault sensing leads 16a and 16b to protect the gate circuitry against a dead short circuit in case one of the triacs should misfire. It will be noted that the pulser-gate circuitry provides contact to capacitor 20 over the period of peak voltage in each cycle of power circuit 14a, 14b.

Local oscillator 28 conprises a "parallel T" circuit as is well-known in the art. It includes transistors 80 and 82, capacitors 84, 86, 88 and 90, and resistors 92, 94, 96, 98, 100, 102, 104, 106, 108 and 110. Resistor 110 is variable and controls the frequency of the local oscillator. A preferred frequency for this oscillator is in the nieghborhood of 200 cycles. Power from the local oscillator is fed to capacitor 20 by transformer 112. Fault currents at both line frequency and local oscillator frequency flow through line 30, resistor 32 to ground 34. Filter 38 comprising capacitor 114 and inductance 116 bypasses most of the 60 cycle component around resistor 32.

The flow of fault current across resistor 32 is measured by the means for sensing potential difference 36. In the circuit shown, the alternating potential difference between the terminals of resistor 32 is rectified to a direct current potential by the rectifier bridge 118. The output of 118 is fed to a galvanometer movement 120 calibrated for convenience in milliamperes of leakage. A capacitor 122 serves to filter the signal supplied to meter 120. A diode 124 protects the alarm circuit from the effects of direct discharge of capacitor 122. A variable resistor 126 may be used to adjust the sensitivity of meter 120. The output of bridge 118 is also fed to an alarm circuit. This comprises driver transistor 128 with resistors 130, 132 and 134 and capacitor 136 for driving the emitter-follower transistor 138. Resistors 140, 142 and 144 complete the emitter-follower circuit. Variable resistors 140 and 142 may be used for coarse and fine adjustment of the amplification ratio of transistor 138.

Under normal conditions, silicon control rectifier 146 is in a conductive mode. This allows power to flow from X1 through the coil of relay 148 holding the contact to line G6 closed. This energizes the green or "normal" light 150. However, when the transistor 138 becomes sufficiently conductive due to voltage drop in resistor 32, the breakover point of zener diode 152 is reached. When this occurs, the SCR 146 is turned off, relay 148 opens activating red alarm light 154 and buzzer 156. Resistors 160 and 162 set the voltage seen by zener diode 152. Capacitor 164 suppresses transients that otherwise might inadvertently fire SCR 146. Capacitor 166 serves to provide a long time constant for the opening of relay 148 and to prevent transient operation of the same. Pushbotton 168 with relay 170 can be used to manually lock out the buzzer 156 once an alarm signal has been given. The several lines G2, G4, G6, G8 and G10, G11, G12, G14 and G16 provide means for presenting the monitor information to a remotely located station and for tying the monitor to a Master Annunciator and remote control panel.

The integrity of a line isolation monitor depends, among other things, on the connection to ground. A ground monitor loop is shown in block 220. This loop serves to monitor the ground connections included within the loop. It has been found by experience that this includes the area where the greatest possibility of ground loss exists. Normally, current from transformer 222 flows through resistor 224, first contact 226a and second contact 226b of test switch 226 to ground bus 228 and back to 222. Under normal conditions, the gate of SCR 230 is held at ground potential due to the circuit passing through 226a and 226b to ground. If, however, there is a break in the loop from the gate through 226a and 226b, a voltagé will appear across resistor 232 sufficient to trigger SCR 230 causing relay 234 to close and energize an alarm such as light 236. Capacitor 238 serves to smooth the operation of relay 234.

The test switch 226 is used to impose an artificial fault into the circuit. When this switch is depressed, the ground connection is broken and a fault current fed from the power line as shown by 14a, reduced to a threshold value by resistor 227 is inserted. If the line isolation monitor is operative, a fault will be indicated upon depression of the test switch. Relay 231 operated from control line G11 with contacts 231A and 231B serves the same function by remote control as test switch 226.

Figure 7:
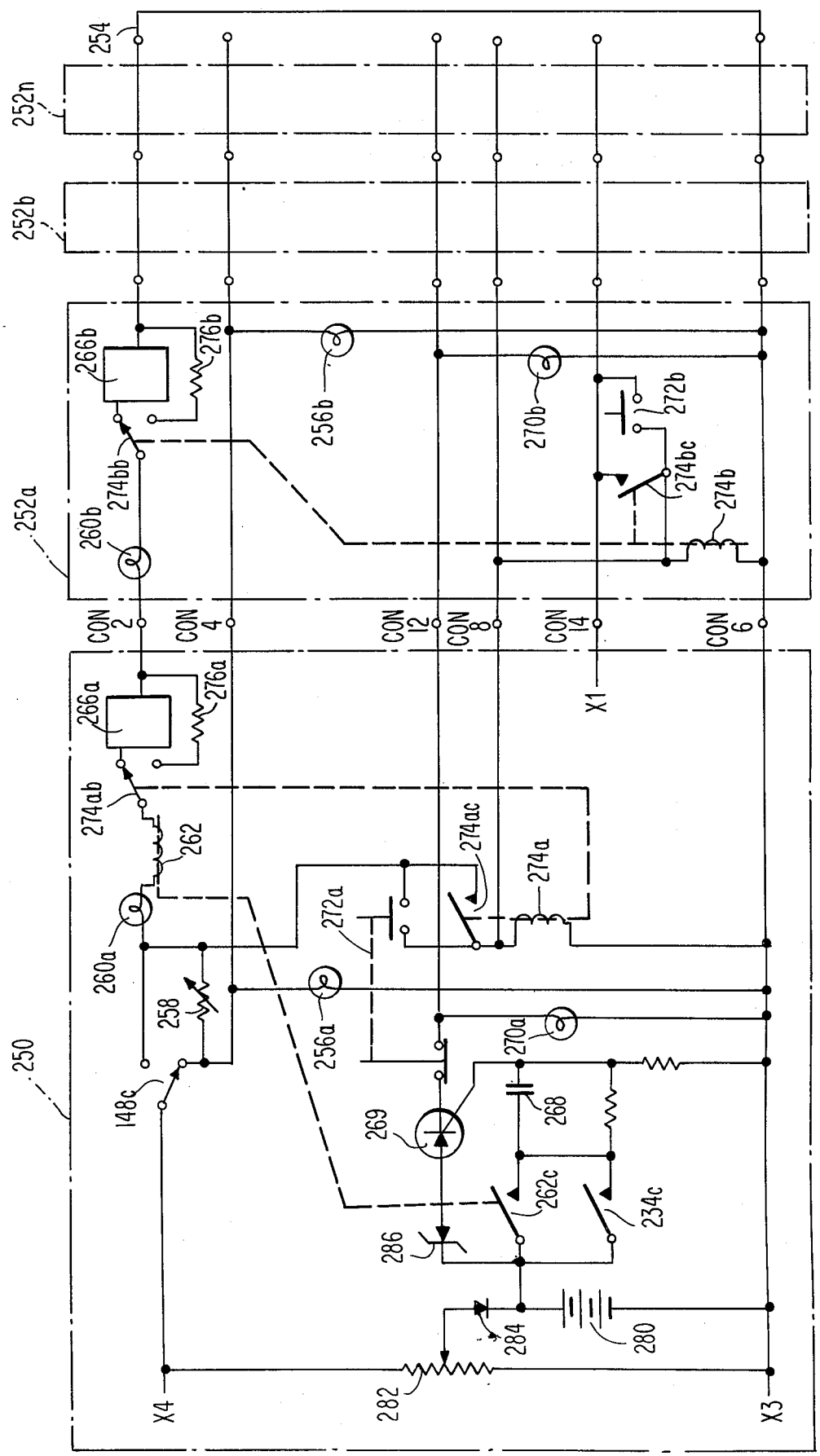
FIG. 7 is the wiring diagram of a further embodiment of the Line Isolation Monitor of FIG. 2.

A further embodiment of the monitor for monitoring the continuity of the alarm circuit is shown in FIG. 7. In this diagram, four blocks are shown, a master unit 250, a first remote station 252a and additional remote stations 252b and 252n. Remote stations may be added or removed as needed. The circuitry of the remote stations is identical except for the Nth unit. The Nth unit includes a loop completion link 254.

A power line X4 feeds to relay contacts 148C. These contacts are operated by relay 148 of FIG. 2. In the normal position, power from X4 is fed to line Con4. A green light 256a is fed from this line indicating that the line isolation monitor is operating and that no fault exists. Current also passes via variable resistor 258 through lights 260a to 260n, relay coil 262a, contacts 274ab to 274nb, and buzzer coils 266a to 266n. The current is adjusted by resistor 258 to a value low enough that lights 260 do not glow and buzzers 266 do not sound but high enough to energize relay 262. The contacts 262c of this relay close when the relay is de-energized. If the loop Con 2-254-Con6 should be opened, inactivating the monitor system, relay 262 will drop, causing its contacts 262c to close. Current will then flow through capacitor 268 causing SCR269 to fire which energizes line Con 12 and the series of "Trouble" lights 270a to 270n. If a fault is sensed by the line isolation monitor, relay 148 will be energized closing contacts 148C. This permits full current to flow through red alarm lights 260a to 260n and cause buzzers 266a to 266n to sound. At the same instant, green "Normal" lights 256a to n are extinguished. It may be desirable under certain conditions to silence the several buzzers in the alarm circuit. When silence button 272a is pushed, relay 274a is energized swinging the contacts 274AB so as to bypass buzzer 266a with resistor 276a. Contact 274ac causes relay 274a to remain closed. At the same time, relays 274b to 274n are energized so as to bypass all the remaining buzzers.

If there is a break in the ground connection, relay contact 234C will close activating line Con 12 and causing warning lights 270a –n to light as described above.

A buzzer in a remote station may be silenced by closing its silence button 272b to n, also silencing the other buzzers. Closing 272b for example energizes relays 274b to 274n causing contact 274bc to close and hold the relay. This also switches contacts 264b so as to silence buzzer 266b.

In the embodiment shown in FIG. 7, the power supply for SCR 269 and trouble lights 270a to n, is the storage battery 280. In the event of loss of power to the line isolation monitor, the current flow in the alarm circuit loop will cease. This causes relay 262 to open closing contacts 262c, firing SCR 269 and activating the line G12 and the trouble alarm lights 270a, b, n. Battery 280 is normally kept charged by a charging circuit such as shown by dropping resistor and voltage divider 282 and rectifying diode 284. A voltage limiter such as zener diode 286 can be placed in the feed to SCR 280 to prevent overdischarge of the battery 280.

Figure 6:
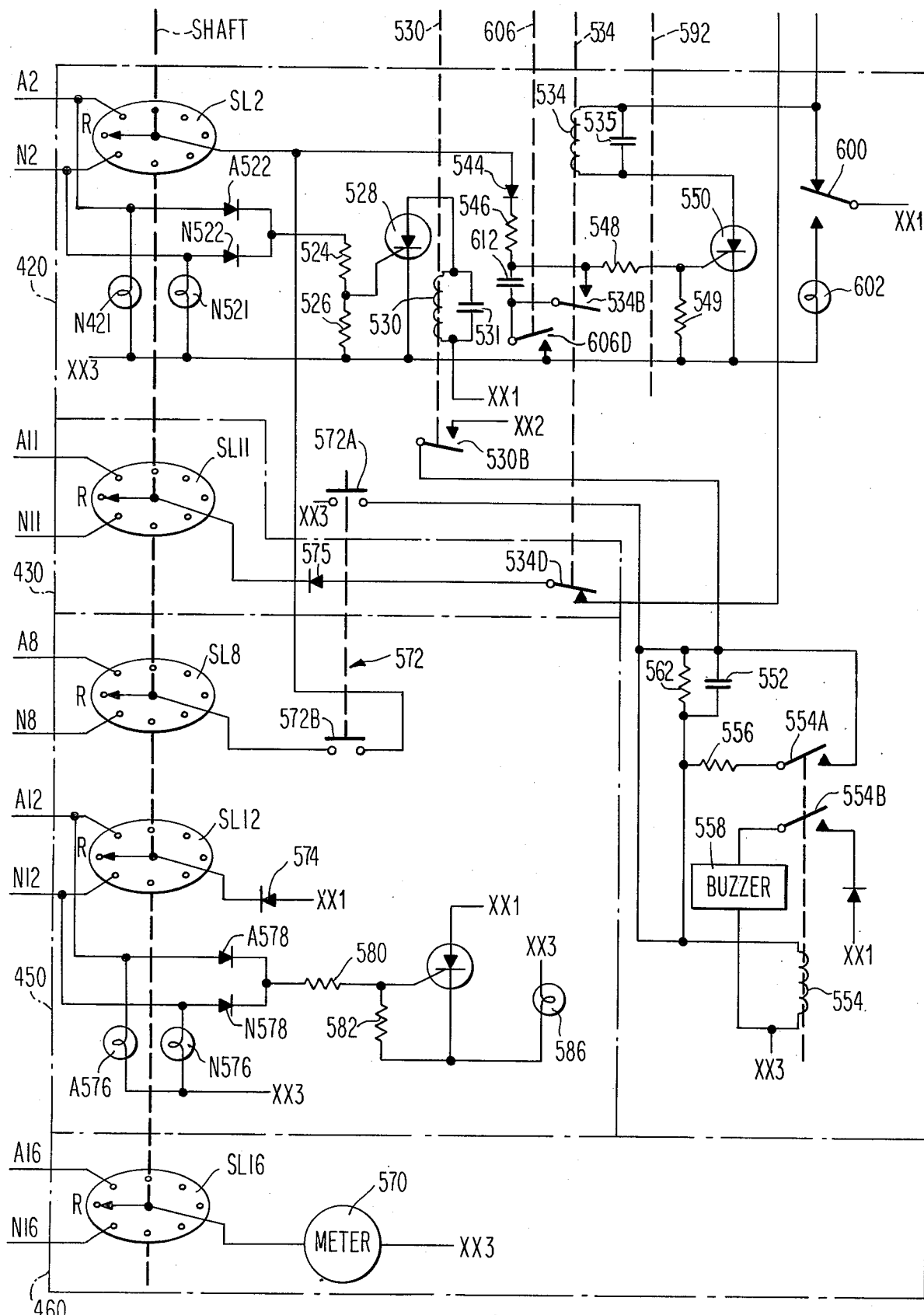

Summarizing the monitor circuitry, each monitor is provided with six signals leads tying into the master unit of the invention. In FIGS. 5 and 6 the leads are identified as A2 to N2, A6 to N6, A8 to N8, A11 to N11, A12 to N12 and A16 to N16. In FIG. 2 representing a single power supply and its monitor, the leads are identified as G2, G6, G8, G11, G12 and G16. The six leads from each isolated power supply are brought to the Master Unit of the invention. The leads A6 to N6 form a common but ungrounded line and are connected together to line XX3 of the Master Unit.

In each monitor such as the Gth, the five active leads perform the following functions:

Line G2 provides a steady Dc signal when the leakage current of power supply PSG is greater than a preselected value.

Line G16 provides a direct current signal proportional to the leakage current suitable for operating a meter movement in the Master Unit.

Line G12 provides a steady direct current signal to the Master Unit in the event that certain vital circuitry in the remote Monitor should fail.

Line G8 is connected into the remote monitor G to enable the audible alarm in Monitor G to be silenced from the Master Unit.

Line G11 is connected into the remote Monitor G so that when a signal is fed by the Master Unit to Monitor G an artificial fault is connected thereto.

Figure 3:
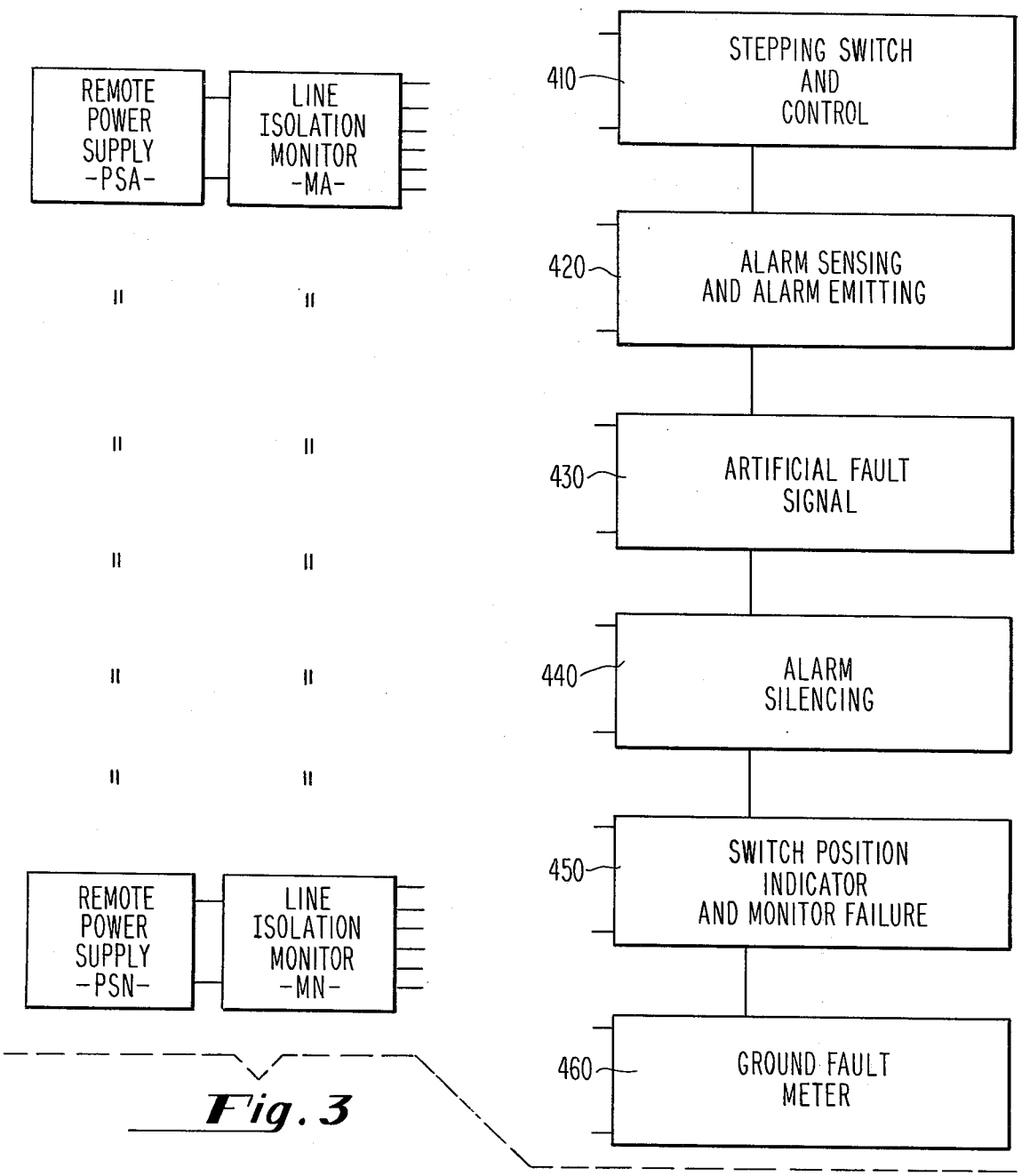
FIG. 3 depicts in block form an installation of several Remote Power Supplies connected to a Master Annunciator and Central Control Unit.

FIGS. 3 shows in block form a series of remote power supplies PSA to PSN, a series of line isolation monitors MA to MN, each associated with an individual power supply and the Master Unit of the invention, shown as blocks 410 to 460 at the right side of the figure. The first portion of the master unit is a means for indexing a multi-position switch and its control shown at 410

The multi-position switch has five contact levels. Each contact level serves a more or less independent functional entity.

The first entity 420 is a means for sensing an alarm location and for emitting a local alarm signal. The means for sensing receives the lines A2 to N2.

A second entity receives the lines A11 to N11 and is a means 430 for sending an artificial fault signal from the master unit to any chosen remote unit.

A third entity receives lines A8 to N8 and is a means 440 for silencing an audible alarm in any chosen remote unit.

A fourth entity receives lines A12 to N12 and is a means 450 for indicating the position of the multi-position switch 410 and a means for indicating the failure of the ground connection, the power supply or the alarm loop of any monitor associated with the remote power supplies.

The fifth and last entity receives lines A16 to N16 and is a means 460 for measuring the magnitude of the ground leakage of any chosen Remote Power Supply.

A complete wiring diagram for a Master Unit of the invention is shown in FIGS. 4, 5, and 6.

FIG. 4 depicts a power supply for the master unit. This comprises a transformer 500 fed from a local power source. The output of the transformer, a voltage in the neighborhood of 28 volts, feeds an AC lead XX1, a rectifier 502 and a capacitor 504. The rectifier-capacitor branch feeds a DC lead XX2. XX3 is the common or return lead. A normally closed pushbutton 506 is provided to temporarily cut off the power supplied by this unit.

In FIGS. 5 and 6, the blocks of FIG. 3 are indicated in dot-dash lines. The five contact levels of the stepping switch 410 are indicated from top to bottom by SL-2, SL-11, SL-8, SL12 and SL-16. In order to simplify the diagram, each level is shown with seven active switch contact positions and a single rest position R. The rest position is the initial position of the switch. It is an "alert" position and from this position the master will automatically seek and identify an alarm signal. Only two sets of leads from two remote stations are shown, the leads from the Ath remote station and the leads from the Nth remote station. These leads are from top to bottom A2, N2, A11, N11, A8, N8, A12, N12, A16 and N16. It is to be understood that the total number of sets of leads is limited only by the size of available stepping switches. In one available stepping switch design, provision is made for 10 remote stations, however, larger stepping switches are available and it is also possible to connect several stepping switches into a multiple series array so as to monitor more than 10 remote stations. In FIG. 5, the stepping switch rotates clockwise. It is rotated by the stepping switch motor 520 comprising a solenoid and a ratchet device as is well known in the art. A capacitor 521 supplies a lag feature to motor 520.

The leads A2–N2 connect directly to a group of red signal lights A421 to N421. Leads A2–N2 also are connected through parallel connected isolating diodes A522, N522 to a voltage divider 524, 526 the output of which feeds the gate of SCR 528. When a ground fault occurs at a remote station greater than the permissible maximum, a signal is sent from the remote monitor via one of the leads A2–N2 to the master station. When this occurs, the appropriate red signal light is illuminated and the signal passes through the appropriate diode to SCR 528.

The anode of SCR 528 is fed to the relay 530. Relay 530 has two normally open contacts 530A and 530B. A condenser 531 permits relay 530 to close only on a continuous alarm signal from lines A2–N2. The closing of contacts 530B connects lead XX2 to capacitor 552 and a pulse of current flows through the coil of relay 554, closing the relay. When the relay closes, contacts 554A bypass capacitor 552 via resistor 556 and keep relay 554 closed. Contacts 554B operated by relay 554 connect alarm buzzer 558 to power lead XX1 via rectifying diode 560. Resistor 562 is provided to leak the charge from capacitor 552. Thus, an audible alarm is sounded when a dangerous fault current is signalled by any of the monitors.

The closing of contacts 530A supplies power from lead XX2 via the contacts 532A of cam operated switch 532 normally closed contacts 534A of relay 534 and voltage divider 536, 538 to the gate of SCR 540 causing SCR 540 to conduct. When 540 conducts, the stepping switch motor 520 is energized, pulling the switch one notch clockwise. When the motor is energized, it closes normally open switch 542. This short circuits the control signal to SCR 540 thus de-energizing the stepping switch motor 520. A single energizing and de-energizing of motor 520 causes the stepping switch to rotate one notch clockwise. When the stepping switch moves off its "rest" position, the contacts 532A of cam operated switch 532 swing and allow current from source XX2 to bypass the contacts 530A of relay 530. When the stepping switch motor 520 is de-energized, switch 542 opens. SCR 540 then conducts again, the motor 520 is energized and the stepping cycle is repeated. The stepping continues until the contact of SL2 contacts the incoming line carrying the fault signal. When this occurs, the fault signal is passed by blocking diode 544, resistor 546 and voltage divider 548 and 549 to the gate of SCR 550 causing SCR 550 to conduct. This in turn energizes relay 534 having retarding capacitor 535 across it, opening contacts 534A which cuts off the power supply to the gate of SCR 540 and stops the stepping switch motor 520.

The foregoing constitutes the alarm circuit. Stepping switch level SL 16 connects meter 570 sequentially to leads A16, N16 and places meter 570 sequentially in parallel with the meters G120 of each monitor. When an alarm occurs as described above, meter 570 gives a reading of the magnitude of the fault so that an observer at the master unit will be aware of the seriousness of the faults. Under certain conditions as for instance when making routine tests of the monitor circuits, it is permissible to silence the audible alarms both at the master unit and at the remote monitor. The closing of double push-button switch 572 serves this double purpose. When contacts 572A are closed, the input to the coil of relay 554 is reduced to XX3 potential. This de-energizes relay 554 opening contacts 554B silencing the buzzer 558 and also opening contacts 554A. There is now no longer a feed to 554 because relay 530 and contact 530B only closed momentarily. Therefore, when switch 572 is released, the buzzer 558 remains silenced. Closing switch 572 also closes contact 572B. This returns a portion of the original alarm signal from a faulted remote monitor back to the monitor via the fault lead G8. This energizes the relay 170 at the remote station and de-energizes the remote station buzzer 156. When pushbutton 572 is released, relay 170 remains energized via contact 170b as long as a fault signal appears on line G2.

Stepping switch level SL 12 connects line XX1 via blocking diode 574 to the several green position indicating lights A576, N576. The green lights give a positive indication of the position of the stepping switch.

There is a possibility that a remote station may lose its ground connection.

In the circuitry of FIG. 2, a ground connection monitor is shown in box 220. In the event of a ground fault, relay 234 is energized closing contacts 234B and connecting line G12 to power lead XX1. The signal from G12 passes through the blocking diode G578 of the series A578–N578, through the voltage divider 580, 582 to the gate of SCR 584. This causes 584 to conduct and energizes monitor failure light 586. The signal from G12 also illuminates green position light G576 which indicates the location of the monitor having a ground failure.

In another embodiment of the line isolation monitor of U.S. patent application Ser. No. 518,098 and described above in FIG. 7, line G12 is energized if any of the following forms of failure occur, a loss of ground, a loss of power to the remote monitor or the breaking of a loop circuit forming a part of the monitor of FIG. 7.

The present regulations concerned with power supplies in hospitals require that the functioning of all line isolation monitors be checked at regular intervals. In a large hospital installation, the individual isolated power supplies may be located a considerable distance apart and the effort of making routine checks becomes somewhat onorous on the hospital staff. In the Master Unit of the present invention, this checking operation may be carried out entirely at the Master Unit.

In a first checking operation, normally open "check" push buttom switch 590 is activated. This momentarily closes contacts 590A and 590B. Closing 590a sends a current pulse to SCR 540 and causes stepping switch 520 to start. This reverses contact 532A and 532B. Closing 532A allows the stepping switch 520 to continue until a complete scan has been made. Closing contact 590B energizes relay 592. Capacitor 594 adds a slight delay in the closing of this relay. Light bulb 596 is parallel with relay 592 indicates that the "test" scan is in progress. The reversal of contact 532B keeps relay 592 energized for the complete scan and opening the relay when the scan is complete. The closing of relay contact 592B puts capacitor 598 across the coil of the stepping switch motor 520. The size of this capacitor is chosen so as to extend the time of each step for several seconds. This allows time for the operator to read the value of the leakage current of each remote station in turn. If the operator should wish to hold the switch at a particular station single pole double throw switch 600 is swung. This removes the power source from SCR 540 and from the motor 520. At the same time, signal light 602 is energized to indicate that the device is on "hold". Reversing of the "hold" switch 600 allows the scanning cycle to continue until it is completed and has been stopped by the cam swtich 532.

In a second check operation, "test" push button switch 604 is momentarily closed. The contacts 604A start the stepping motor as described above. Closing of contacts 604B energizes relay 606 with delay capacitor 608 and "test" lamp 610 in parallel therewith. Relay 606 has four sets of contacts. Opening of the normally closed contacts 606A de-energizes relay 592 so that the "test" sequence takes precedence over the "check" sequence of operations. Contacts 606B along with contacts 532B allow the "test" sequence to continue until a complete scan has been completed. Closing of contact 606D puts capacitor 612 in series with resistor 546 and causes a delay in the firing of SCR 550. The shift in contact 606C puts the control of SCR 540 through switch contacts 534C, capacitor 614, resistor 616, alternate resistor 618 and SCR 620. The closing of 604B followed by the closing of 606B sends a steady power signal through contacts 534D, blocking diode 575 stepping switch level SL11 to the series of leads A11–N11. Each of these leads connects to a relay 231 in each Remote Monitor. The closing of relay 231 opens contacts 231A and breaks the ground connection of the monitor. The shift of contacts 231B connects line 14a of the remote power supply 10 through resistor 227 to the monitor circuit. This has the effect of putting a ground fault on the power supply. If all is operating properly, the monitor responds by sending an alarm signal via G2 to the Master Unit. This is indicated by the lighting of the proper red alarm light, the sounding of the alarm buzzer and a meter reading showing the value of the leakage current.

Capacitor 612 charges up slowly to the firing voltage of SCR 550. The time constant is about 5 or 6 seconds so as to allow ample time for the operator to observe the alarms and read the meter. Capacitor 614 is also charging through contacts 606C and 534C. When SCR 550 fires, relay 534 is energized and contact 534D is opened. This removes the artificial fault from the power source under test. The alarm signal from G2 stops and relay 534 opens somewhat later due to the charge on capacitor 535. At the same time, contacts 534C reverse causing capacitor 614 to discharge through resistors 618 and 616 and firing SCR 620. This in turn fires SCR 540 and the stepping switch 520 is advanced one step. The test cycle then repeats for this station of the stepping switch. This continues till all the remote power supplies have been tested. If a remote power supply should fail to return a fault signal, the cycle stops because the advance of the stepping switch is dependent upon the charging of capacitor 612 by the alarm signal. The "test" cycle may be resumed by momentarily reclosing switch 630. Either the "check" or the "test" regimes may be halted at any time and the Unit brought back to the rest position by opening the manual "reset" button 506. This stops all power to the unit and all the relays drop out. When power is again applied upon the reclosing of 506, the unit is in a normal search condition and will step itself back to rest, or to an alarm signal if one should be present.

It is possible that during the monitoring of a faulty remote power source a second power source may develop a dangerous ground fault. If this occurs, the red alarm light for the second power source will light as well as the red alarm light for the first remote source. However, the stepping switch will not of itself swing off the first alarm position. To monitor the second alarm position, the "advance" switch 630 must be momentarily closed. Closing 630 sends a pulse of current to SCR 540 and causes the stepping switch motor to advance one step. The motor will then continue stepping until it finds the second alarm position. The "advance" switch 630 will override the "hold" switch 600 for an individual step. By this means, a fully manual stepping operation may be obtained.

Having described my invention and given a full explanation of its embodiment, I now claim:

1. In a power distribution system comprising a plurality of isolated power supplies and a plurality of line isolation monitors wherein each line isolation monitor is operatively connected to an individual isolated power supply and wherein each line isolation monitor comprises:

a. a power supply;
   b. measuring means for measuring the leakage current to ground of the individual isolated power supply to which it is connected;
   c. first alarm means for emitting a first audible alarm signal and an electrical alarm signal when the leakage current to ground is greater than a chosen limit;
   d. first silencing means for silencing the first audible signal; and
   e. test means for inserting an artificial current leakage to ground in the isolated power supply to which it is connected.

the improvement comprising: a single master annunciator and remote control unit for monitoring and controlling each line isolation monitor, said single master annunciator and remote control unit being operatively connected to each line isolation monitor via a plurality of connecting circuits with each connecting circuit connecting an individual line isolation monitor to the master annunciator and remote control unit, the single master annunciator and remote control unit comprising:

1. second alarm means for emitting a second audible alarm when any line isolation monitor emits an electrical alarm signal;
   2. indicating means for indicating which of the plurality of line isolation monitors is emitting an electrical alarm signal;
   3. second silencing means for silencing the second audible alarm in the master annunciator and remote control unit;
   4. energizing means for energizing the first silencing means in any line isolation monitor emitting an audible alarm and for energizing the second silencing means to thereby simultaneously silence both the first and second audible alarms;

5. single means for sequentially determining the magnitude of any leakage current in each isolated power supply;
6. activating means for sequentially activating the test means of each of the plurality of line isolation monitors to thereby sequentially insert an artificial current leakage to ground in each of the isolated power supplies;
7. line isolation monitor failure means for emitting a failure alarm signal upon the occurance of at least one of the following events, failure of the power supply of any of the line isolation monitors, loss of ground connection in any of the line isolation monitors and opening of the alarm signal loop of any of the line isolation monitors;
8. identifying means for identifying the line isolation monitor emitting a failure alarm signal, and;
9. aborting means for aborting any sequential function and returning the master annunciator and remote control unit to an initial alert position.

2. A power distribution system as defined in claim 1 including means in the master annunciator and remote control unit for continuously determining the magnitude of the leakage current of any chosen isolated power supply.

* * * * *